(12) United States Patent
Park

(10) Patent No.: US 11,791,433 B2
(45) Date of Patent: Oct. 17, 2023

(54) SINGLE PHOTON AVALANCHE DIODE

(71) Applicant: SK hynix Inc., Icheon-si (KR)

(72) Inventor: Soon Yeol Park, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 182 days.

(21) Appl. No.: 17/320,605

(22) Filed: May 14, 2021

(65) Prior Publication Data
US 2022/0254946 A1 Aug. 11, 2022

(30) Foreign Application Priority Data
Feb. 9, 2021 (KR) .......................... 10-2021-0018102

(51) Int. Cl.
*H01L 31/107* (2006.01)
*H01L 31/0352* (2006.01)

(52) U.S. Cl.
CPC ...... *H01L 31/107* (2013.01); *H01L 31/03529* (2013.01)

(58) Field of Classification Search
CPC ............. H01L 31/107; H01L 31/03529; H01L 31/111; H01L 31/035272; H01L 31/022408; H01L 27/1461; H01L 27/1463
See application file for complete search history.

(56) References Cited

U.S. PATENT DOCUMENTS

| | | | |
|---|---|---|---|
| 9,178,100 B2 | 11/2015 | Webster et al. | |
| 2010/0271108 A1 | 10/2010 | Sanfilippo et al. | |
| 2014/0138735 A1* | 5/2014 | Clarke | H01L 29/7412 257/119 |
| 2016/0268245 A1* | 9/2016 | Chen | H01L 27/0248 |
| 2020/0091205 A1 | 3/2020 | Shinohara | |
| 2020/0152807 A1* | 5/2020 | Röhrer | H01L 31/035272 |
| 2020/0185560 A1* | 6/2020 | Giroud-Garampon | H01L 31/035263 |

* cited by examiner

*Primary Examiner* — Sitaramarao S Yechuri
(74) *Attorney, Agent, or Firm* — Perkins Coie LLP

(57) ABSTRACT

A single photon avalanche diode may include a substrate and a plurality of junction structures supported by the substrate. The substrate may have an upper surface and a lower surface that are opposite to each other. The junction structures may support by the substrate to make contact with the upper surface of the substrate. The junction structures may include portions that overlap with each other in a vertical direction perpendicular to the substrate. Each of the junction structures may include a first impurity region having a first conductive type and disposed to make contact with the upper surface of the substrate, and a second impurity region having a second conductive type and disposed to make contact with the upper surface of the substrate and a bottom surface of the first impurity region. The first impurity region and the second impurity region in each of the junction structures may be configured to receive a bias voltage through the upper surface of the substrate.

20 Claims, 9 Drawing Sheets

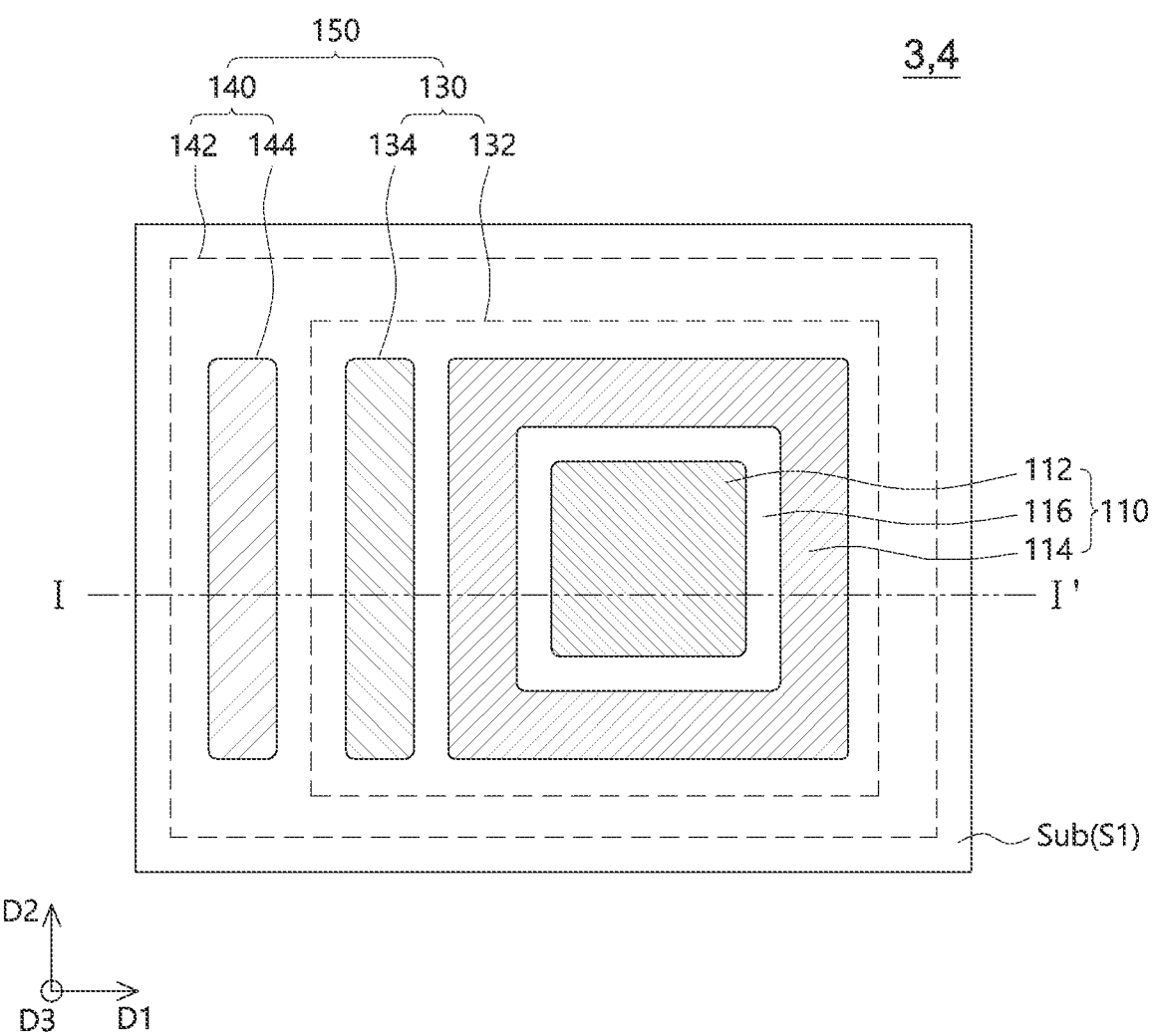

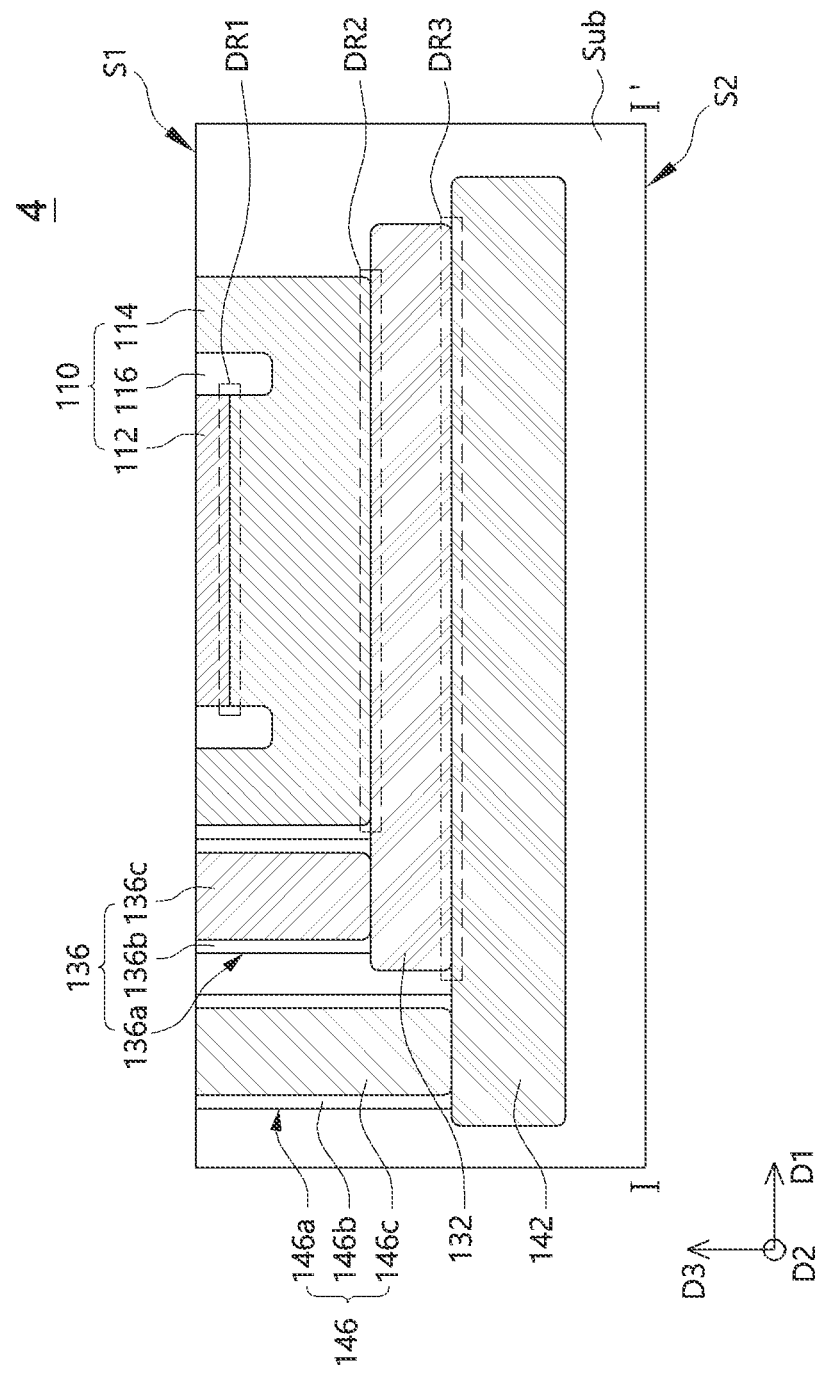

SINGLE PHOTON AVALANCHE DIODE

CROSS-REFERENCES TO RELATED APPLICATION

This patent document claims the priority and benefits of Korean patent application number 10-2021-0018102, filed on Feb. 9, 2021, which is incorporated herein by reference in its entirety.

TECHNICAL FIELD

The technology and implementations disclosed in this patent document generally relate to a single photon avalanche diode.

BACKGROUND

A Recently spotlighted time of flight (TOF) technology may include irradiating a light having a pulse shape to an object from a light source in or around a sensor, receiving a reflected light to measure a time between the object and the light source, and extracting a distance between the object and the light source based on a principle of constancy of light velocity.

In order to accurately measure the TOF, a reaction needs to be generated as soon as the light is received by a light-receiving element. Thus, a photoelectric transformation element having a high sensitivity is desired. A single photo avalanche diode (SPAD) manufactured by a CMOS process technology has been widely studied and developed.

SUMMARY

Example embodiments of the disclosed technology provide a single photon avalanche diode including multi-depletion regions.

In one aspect, a single photon avalanche diode is provided to include a substrate and a plurality of junction structures supported by the substrate. The substrate may have an upper surface and a lower surface that are opposite to each other. The junction structures may support by the substrate to make contact with the upper surface of the substrate. The junction structures may include portions that overlap with each other in a vertical direction perpendicular to the substrate. Each of the junction structures may include a first impurity region having a first conductive type and disposed to make contact with the upper surface of the substrate, and a second impurity region having a second conductive type and disposed to make contact with the upper surface of the substrate and a bottom surface of the first impurity region. The first impurity region and the second impurity region in each of the junction structures may be configured to receive a bias voltage through the upper surface of the substrate.

In another aspect, a single photon avalanche diode is provided to include a substrate, a first impurity region having a first conductive type supported by the substrate, a second impurity region having a second conductive type supported by the substrate, a third impurity region having the first conductive type supported by the substrate and a fourth impurity region having the second conductive type supported by the substrate. The substrate may have an upper surface and a lower surface. The first impurity region may make contact with the upper surface of the substrate. The second impurity region may partially make contact with the upper surface of the substrate. The second impurity region may make contact with a bottom surface and a side surface of the first impurity region. The third impurity region may make contact with a bottom surface of the second impurity region. The fourth impurity region may partially make contact with the upper surface of the substrate. The fourth impurity region may make contact with a bottom surface and a side surface of the third impurity region.

According to example embodiments, the junction structures may be vertically overlapped with each other to form the single photon avalanche diode including multi-depletion regions. Thus, the single photon avalanche diode may have multi operational voltages corresponding to numbers of the multi-depletion regions. Therefore, the single photon avalanche diode may have improved detection sensitivity in various environments and wide application fields.

BRIEF DESCRIPTION OF THE DRAWINGS

The above and another aspects, features and advantages of the subject matter of the disclosed technology will be more clearly understood from the following detailed description taken in conjunction with the accompanying drawings.

FIG. 3A is a plan view illustrating a single photon avalanche diode in accordance with example embodiments of the disclosed technology.

FIGS. 3B and 3C are cross-sectional views taken along a line I-I' in FIG. 3A.

DETAILED DESCRIPTION

Various embodiments of the disclosed technology will be described in greater detail with reference to the accompanying drawings.

The disclosed example embodiments may provide a single photon avalanche diode including multi-depletion regions and having a plurality of operational voltages. In comparison, some designs of conventional single photo avalanche diodes may have only one operational voltage. The single photo avalanche diode may have a photo detection sensitivity and an application field that corresponds to an operational voltage. Thus, when the single photon avalanche diode has the plurality of the operational voltages, the single photon avalanche diode can be widely used in various fields.

For example, the single photon avalanche diode may be used for a photoelectric transformation element including a photosensitive P-N junction. The single photon avalanche diode may receive and detect a single photon from an object to generate a current pulse corresponding to the detected single photon. An avalanche breakdown may be triggered by an incident single photon in the Geiger mode where a reverse bias voltage including a voltage between a cathode and an anode higher than a breakdown voltage may be applied to generate the current pulse. The avalanche breakdown may be generated at a depletion region in the single photon avalanche diode. When the reverse bias voltage is applied to the single photon avalanche diode to increase an electric field, electrons, which have been generated by absorption of incident photons, may move due to the presence of the strong electric field and the impact ionization occurs to generate an electron-hole pair. In the single photon avalanche diode operated in the Geiger mode where the reverse bias voltage higher than the breakdown voltage is applied, carriers such as electrons or holes, which may be generated by the incident light, and the electrons and the holes, which may be generated by the impact ionization, may collide against each other to generate numerous carriers. Therefore, although the single photon is incident to the single photon avalanche diode, the single photon may trigger the avalanche breakdown to generate a measurable current pulse.

Hereinafter, a first conductive type and a second conductive type refer to complimentary conductive types. The first conductive type may be a P type and the second conductive type may be an N type. A first direction D1, a second direction D2 and a third direction D3 may be substantially perpendicular to each other. For example, in an XYZ coordinate, the first direction D1 may be an X-direction, the second direction D2 may be a Y-direction, and a third direction D3 may be a Z-direction.

Figure 1A:
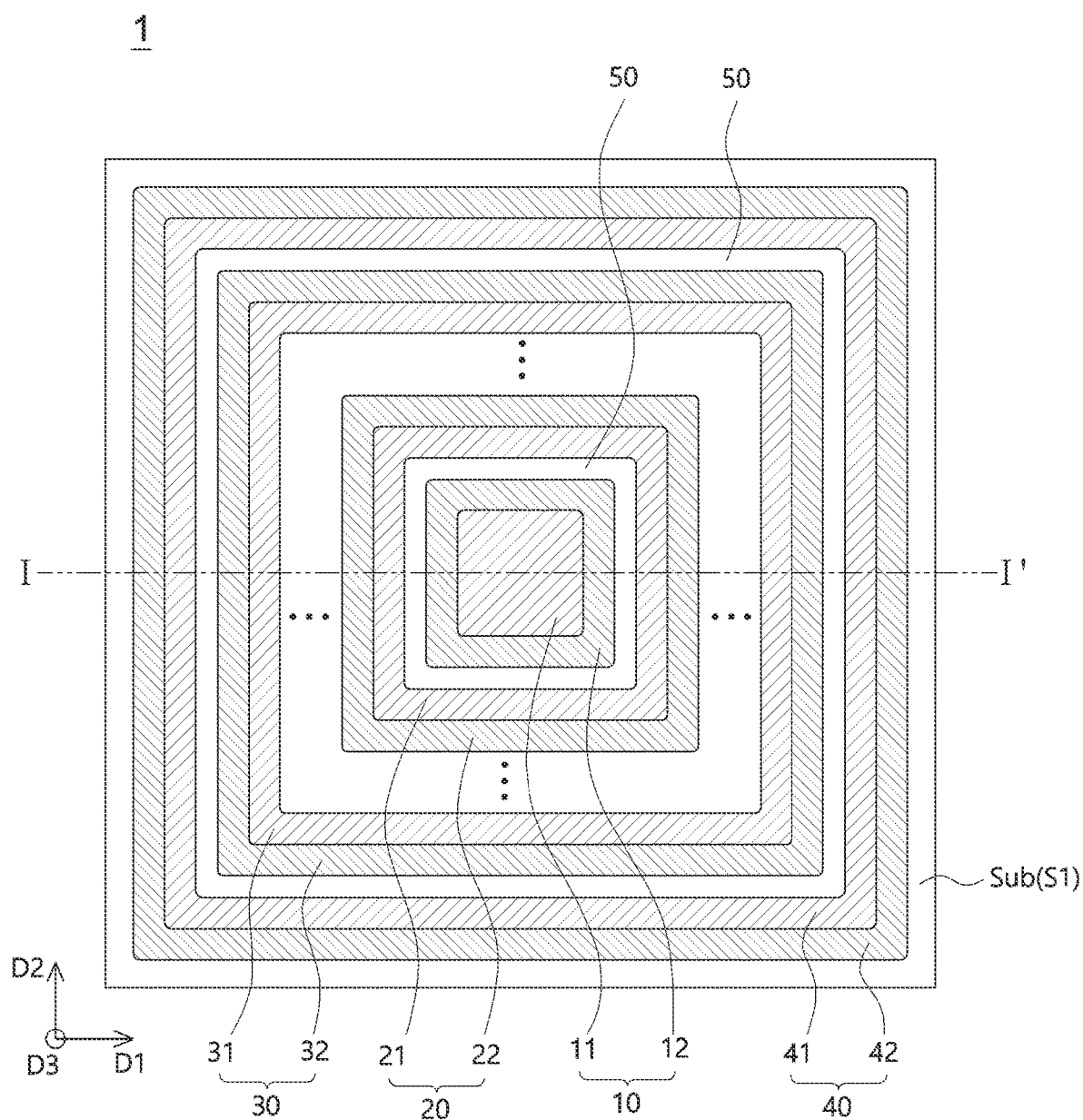
FIG. 1A is a plan view illustrating a single photon avalanche diode in accordance with example embodiments of the disclosed technology.
Figure 1B:
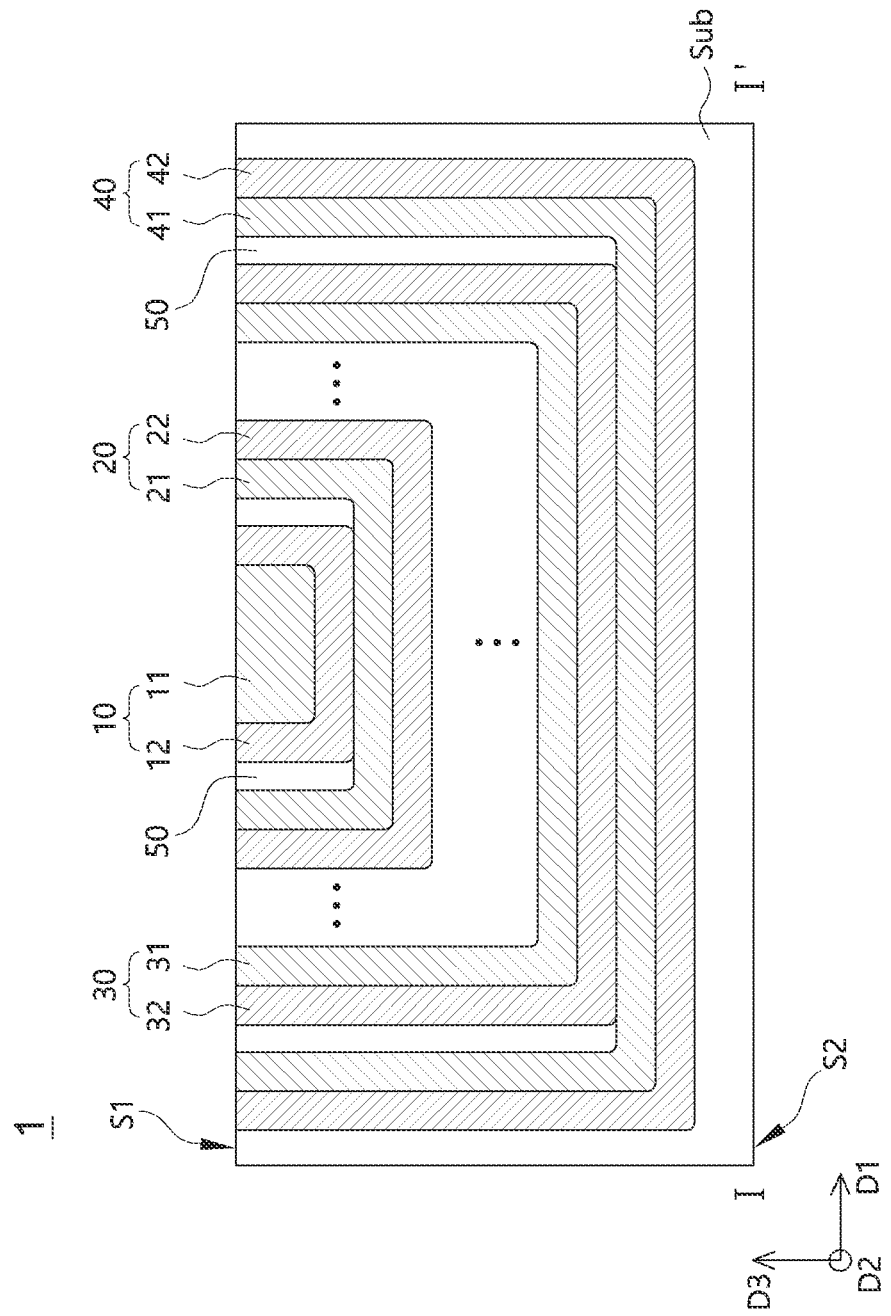
FIG. 1B is a cross-sectional view taken along a line I-I' in FIG. 1A.

FIG. 1A is a plan view illustrating a single photon avalanche diode in accordance with example embodiments, and FIG. 1B is a cross-sectional view taken along a line I-I' in FIG. 1A.

Referring to FIGS. 1A and 1B, a single photon avalanche diode 1 of example embodiments may include a substrate Sub and a plurality of junction structures 10, 20, 30 and 40. The substrate Sub has an upper surface S1 and a lower surface S2. The junction structures 10, 20, 30 and 40 may be formed on the substrate Sub to make contact with the upper surface S1 of the substrate Sub. The junction structures 10, 20, 30 and 40 may be overlapped with each other along the third direction D3. Each of the junction structures 10, 20, 30 and 40 may include a P-N junction diode. Each of an anode and a cathode of the P-N junction diode of each junction structure may be configured to receive a bias voltage to operate the single photon avalanche diode. For example, the bias voltages that are received by the anode and the cathode of different junction structures may be adjusted to provide different operational voltages of the diode.

Further, the single photon avalanche diode 1 may include isolation regions 50 formed at the substrate Sub. The isolation regions 50 may be arranged between any two adjacent ones of the junction structures 10, 20, 30 and 40. Each of the isolation regions 50 may have a pipe shape configured to make contact with the upper surface S1 of the substrate Sub. Each of the isolation regions 50 may be extended in the third direction D3. Each of the isolation regions 50 may include impurity regions 11, 21, 31 and 41 having the first conductive type, or a trench type isolation layer. The trench type isolation layer may include a trench formed on the upper surface S1 of the substrate Sub, and an insulation layer formed in the trench.

The substrate Sub may include a bulk single crystalline silicon wafer, a silicon-on-insulation (SOI) wafer, a compound semiconductor wafer such as Si—Ge, a wafer including a silicon epitaxial layer, etc. For example, the substrate Sub may include a bulk single crystalline silicon wafer doped with first conductive type impurities, for example, P type impurities.

The upper surface S1 of the substrate Sub may be a front side. Although not depicted in drawings, control circuits in FIGS. 4 and 5 for controlling the single photon avalanche diode 1 may be provided, e.g., being formed on the upper surface S1 of the substrate Sub. The lower surface S2 of the substrate Sub may be a back side. Further, the lower surface S2 of the substrate Sub may be an incidence surface to which a light may be incident. Thus, although not depicted in drawings, an optical filter, a micro-lens, etc., may be formed on the lower surface S2 of the substrate Sub.

Each of the junction structures 10, 20, 30 and 40 may include first impurity regions 11, 21, 31 and 41 having the first conductive type and second impurity regions 12, 22, 32 and 42 having the second conductive type. For example, when the first conductive type may be the P type and the second conductive type may be the N type, the first impurity regions 11, 21, 31 and 41 may correspond to an anode and the second impurity regions 12, 22, 32 and 42 may correspond to a cathode. The first impurity regions 11, 21, 31 and 41 and the second impurity regions 12, 22, 32 and 42 in each of the junction structures 10, 20, 30 and 40 may be configured to make contact with the upper surface S1 of the substrate Sub. The first impurity regions 11, 21, 31 and 41 and the second impurity regions 12, 22, 32 and 42 may be configured to receive a bias through the upper surface S1 of the substrate Sub. The second impurity regions 12, 22, 32 and 42 may be configured to surround a side surface and a bottom surface of the first impurity regions 11, 21, 31 and 41. Particularly, the second impurity regions 12, 22, 32 and 42 may be configured to make contact with the side surface and the bottom surface of the first impurity regions 11, 21, 31 and 41.

The first impurity region 11 of the first junction structure 10 positioned at a central portion of the junction structures 10, 20, 30 and 40 may have a plate shape. The second impurity region 12 of the first junction structure 10 may have a cylindrical shape configured to surround the side surface and the bottom surface of the first impurity region. The second impurity region 12 of the first junction structure 10 may have a planar annular shape viewed from the upper surface S1 of the substrate Sub. The second impurity region 12 of the first junction structure 10 may have a planar plate shape viewed from the lower surface S2 of the substrate Sub. The second impurity region 12 of the first junction structure 10 may have a cross-sectional "U" shape.

The second junction structure 20 among the junction structures 10, 20, 30 and 40 may be configured to surround the side surface and the bottom surface of the first junction structure 10. Thus, each of the first impurity region 21 and the second impurity region 22 in the second junction structure 20 may have a cylindrical shape. The isolation region 50 may be positioned between the second impurity region 12 of the first junction structure 10 and the first impurity region 21 of the second junction structure 20. The isolation region 50 may have a depth measured from the upper surface S1 of the substrate Sub that is substantially the same as a depth of the first junction structure 10 inside the isolation region 50.

Among the junction structures 10, 20, 30 and 40, any two adjacent junction structures can be located that one of two junction structures is relatively closer to a central portion of the substrate and the other of the two junction structures is relatively closer to an edge portion of the substrate. The one that is relatively closer to the central portion of the substrate can be referred to as an inner junction structure and the other one that is relatively closer to the edge portion of the substrate can be referred to an outer junction structure. The outer junction structure may be configured to surround the side surface and the bottom surface of the inner junction structure 30. Thus, the first impurity regions 21, 31 and 41 and the second impurity regions 22, 32 and 42 in each of the second junction structure 20 to the fourth junction structure 40 may have a cylindrical shape. The first impurity region 41 of the Nth junction structure 40 may be configured to make contact with the bottom surface of the second impurity region 32 of the (N−1)th junction structure 30, whereby N is an integer greater than 1. Further, the first impurity region 41 of the Nth junction structure 40 may be spaced apart from the side surface of the second impurity region 32 of the (N−1)th junction structure 30. Thus, the isolation region 50 may be inserted into between the side surface of the first impurity region 41 of the Nth junction structure 40 and the side surface of the second impurity region 32 of the (N−1)th junction structure 30 facing the side surface of the first impurity region 41 of the Nth junction structure 40. When the isolation region 50 may include the first conductive type impurity region, the isolation region 50 may have an impurity doping concentration lower than an impurity doping concentration of the first impurity regions 21, 31 and 41.

Vertically extended portions of the first impurity regions 21, 31 and 41 and the second impurity regions 22, 32 and 42 in the second junction structure 20 to the Nth junction structure 40 may have a width less than a vertical depth of horizontally extended portions of the first impurity regions 21, 31 and 41 and the second impurity regions 22, 32 and 42 in the second junction structure 20 to the Nth junction structure 40.

As mentioned above, the plurality of the junction structures 10, 20, 30 and 40 may be vertically stacked such that any two adjacent ones of the junction structures 10, 20, 30 and 40 have a common surface to contact with each other, thereby providing the single photon avalanche diode 1 with the multi-depletion regions. Thus, the single photon avalanche diode 1 may have multi-operational voltages corresponding to numbers of the multi-depletion regions. Therefore, the single photon avalanche diode 1 may have improved detection sensitivity in various environments and wide application fields. One depletion region may be generated at each of the junction structures 10, 20, 30 and 40. Further, one depletion region may also be generated at each of the contact regions between the junction structures 10, 20, 30 and 40.

Figure 2A:
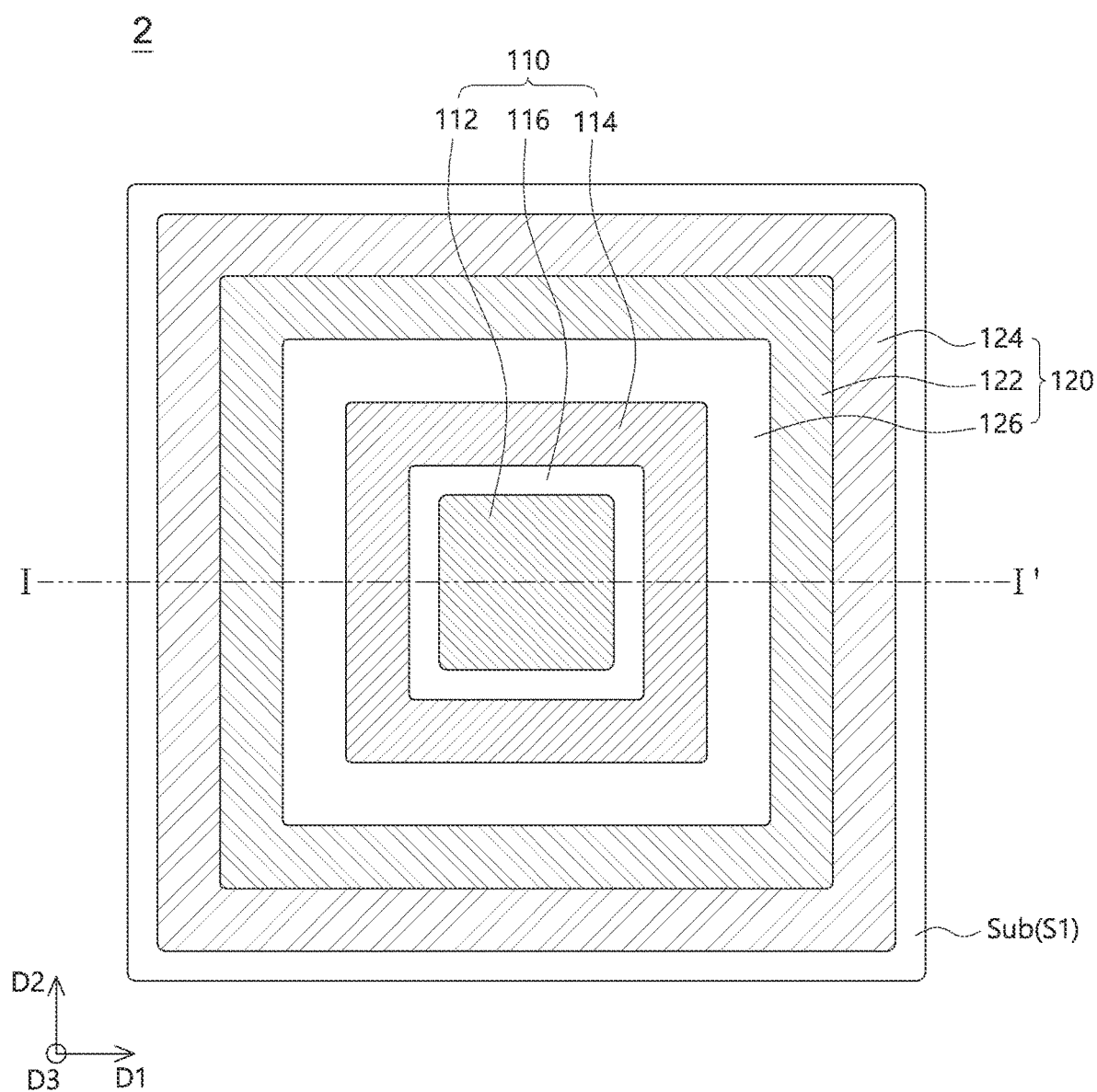
FIG. 2A is a plan view illustrating a single photon avalanche diode in accordance with example embodiments of the disclosed technology.
Figure 2B:
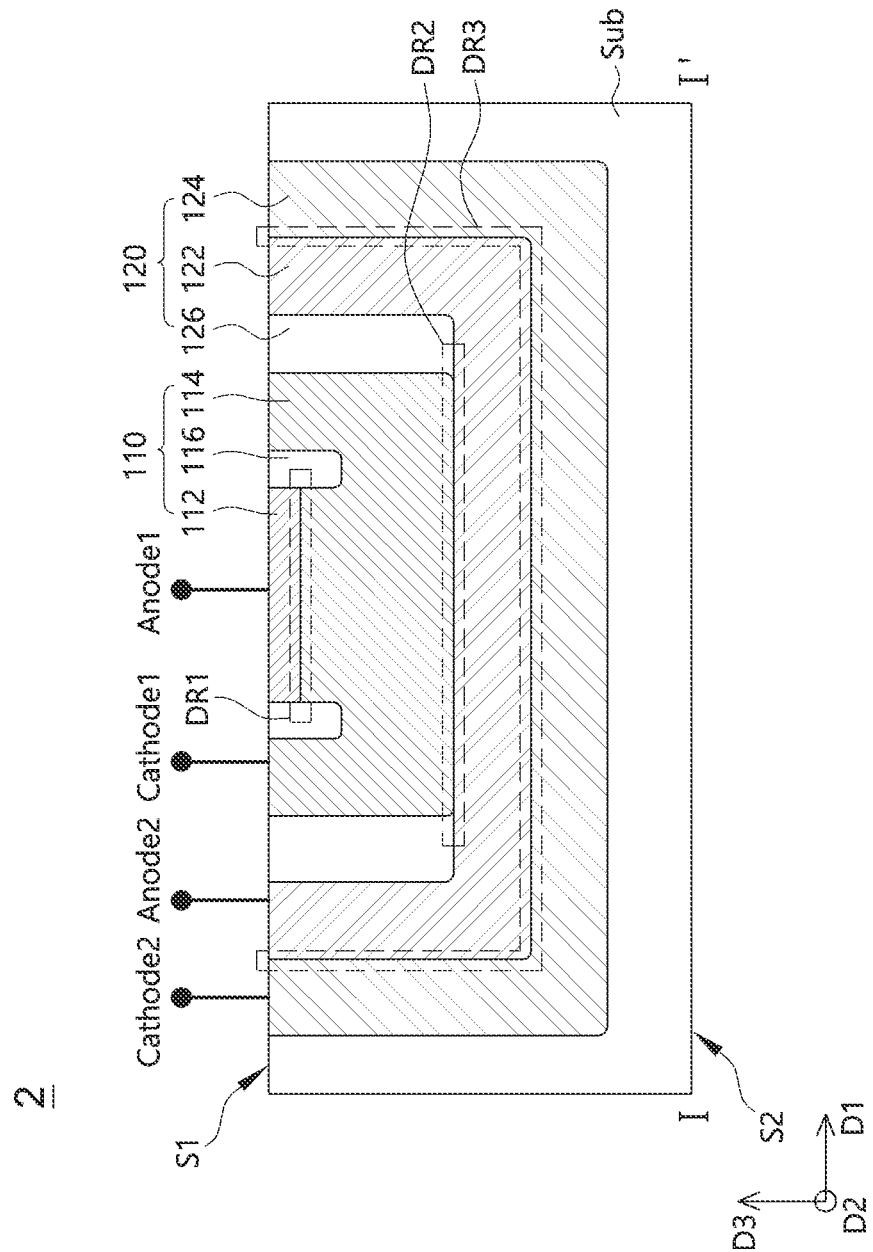
FIG. 2B is a cross-sectional view taken along a line I-I' in FIG. 2A.

FIG. 2A is a plan view illustrating a single photon avalanche diode in accordance with example embodiments, and FIG. 2B is a cross-sectional view taken along a line I-I' in FIG. 2A. Hereinafter, a single photon avalanche diode having different three operational voltages may be illustrated with reference to FIGS. 2A and 2B.

Referring to FIGS. 2A and 2B, the single photon avalanche diode 2 of example embodiments may include a substrate Sub, a first junction structure 110 and a second junction structure 120. The substrate Sub may have an upper surface S1 and a lower surface S2. The first junction structure 110 may be formed on the substrate Sub to make contact with the upper surface S1 of the substrate Sub. The second junction structure 120 may be configured to surround a side surface and a bottom surface of the first junction structure 110. Each of the first junction structure 110 and the second junction structure 120 may include a P-N junction diode. Each of the first junction structure 110 and the second junction structure 120 may include a first anode Anode1, a first cathode Cathode1, a second anode Anode1 and a second cathode Cathode2 configured to receive a bias.

The substrate Sub may include a bulk single crystalline silicon wafer, a silicon-on-insulation (SOI) wafer, a compound semiconductor wafer such as Si—Ge, a wafer including a silicon epitaxial layer, etc. For example, the substrate Sub may include a bulk single crystalline silicon wafer doped with first conductive type impurities, for example, P type impurities. The upper surface S1 of the substrate Sub may be a front side. Although not depicted in drawings, control circuits in FIGS. 4 and 5 for controlling the single photon avalanche diode 1 may be formed on the upper surface S1 of the substrate Sub. The lower surface S2 of the substrate Sub may be a back side. Further, the lower surface S2 of the substrate Sub may be an incidence surface to which a light may be incident. Thus, although not depicted in drawings, an optical filter, a micro-lens, etc., may be formed on the lower surface S2 of the substrate Sub.

The first junction structure 110 may include a first impurity region 112 having a first conductive type and a second impurity region 114 having a second conductive type. When the first conductive type may be a P type and the second conductive type may be an N type, the first impurity region 112 may act as the first anode Anode1 and the second impurity region 114 may act as the first cathode Cathode1. The first anode Anode1 and the first cathode Cathode1 may be configured to receive the bias.

The first impurity region 112 acting as the first anode Anode1 may be formed in the second impurity region 114 to make contact with the upper surface S1 of the substrate Sub. The first impurity region 112 may have a plate shape. The first impurity region 112 may be positioned at a central portion of the single photon avalanche diode 2. The bottom surface of the first impurity region 112 may be configured to make contact with the second impurity region 114. A first depletion region DR1 for providing a first operational voltage may be formed at an interface region between the first impurity region 112 and the second impurity region 114. A bias voltage for applying the first operational voltage to the single photon avalanche diode 2 to perform the photoelectric conversion or transformation using the first depletion region DR1 may be applied to the first cathode Cathode1. A ground voltage may be applied to the first anode Anode1, the second anode Anode1 and the second cathode Cathode1.

The second impurity region 114 acting as the first cathode Cathode1 may be formed on the substrate Sub to partially make contact with the upper surface S1 of the substrate Sub. The second impurity region 114 may be configured to surround the side surface and the bottom surface of the first impurity region 112. Thus, the second impurity region 114 may have a cylindrical shape. That is, the second impurity region 114 may have a planar annular shape viewed from the upper surface S1 of the substrate Sub. In contrast, the second impurity region 114 may have a planar plate shape viewed from the lower surface S2 of the substrate Sub. Further, the second impurity region 114 may have a cross-sectional U shape. The second impurity region 114 may be formed by a well-formation process.

FIGS. 2A and 2B may show one impurity region of each of the first impurity region 112 and the second impurity region 114. Alternatively, the first impurity region 112 may include a plurality of impurity regions stacked in the third direction D3 having the first conductive type. Further, the second impurity region 114 may include a plurality of impurity regions stacked in the third direction D3 having the second conductive type. The stacked impurity regions of each of the first impurity region 112 and the second impurity region 114 may have different doping concentrations. The different doping concentrations may be gradually decreased from the upper surface S1 to the lower surface S2 in the substrate Sub to prevent a punch caused by an expansion of the depletion region, thereby improving breakdown voltage characteristics.

The first junction structure 110 may further include a guard ring 116 formed in the second impurity region 114 to surround the side surface of the first impurity region 112. The guard ring 116 may be configured to make contact with the side surface of the first impurity region 112. The guard ring 116 may have a depth measured from the upper surface S1 of the substrate Sub may be greater than a depth of the first impurity region 112. When the guard ring 116 may include an impurity region having the first conductive type, the guard ring 116 may have a doping concentration less than a doping concentration of the first impurity region 112. A trench type isolation layer may include a trench formed at the upper surface S1 of the substrate Sub, and an insulation layer formed in the trench.

The second junction structure 120 may include a third impurity region 122 having the first conductive type and a fourth impurity region 124 having the second conductive type. When the first conductive type may be a P type and the second conductive type may be an N type, the third impurity region 122 may act as the second anode Anode2 and the fourth impurity region 124 may act as the second cathode Cathode2. The second anode Anode2 and the second cathode Cathode2 may be configured to receive the bias.

The third impurity region 122 acting as the second anode Anode2 may be configured to partially make contact with the upper surface S1 of the substrate Sub. The third impurity region 122 may be configured to make contact with a side surface and a bottom surface of the fourth impurity region 124. In order to improve the breakdown voltage characteristic of the single photon avalanche diode 2, the third impurity region 122 may have a doping concentration less than the doping concentration of the first impurity region 112. Further, a portion of the third impurity region 122 extended in the third direction D3 may have a horizontal width greater than a vertical depth of a portion of the third impurity region 122 extended in the first and second directions D1 and D2.

The third impurity region 122 may be configured to surround the side surface and the bottom surface of the first junction structure 110. Thus, the third impurity region 122 may have a cylindrical shape. The third impurity region 122 may have a planar annular shape viewed from the upper surface S1 of the substrate Sub. The third impurity region 122 may have a planar plate shape viewed from the lower surface S2 of the substrate Sub. Further, the third impurity region 122 may have a cross-sectional U shape. The third impurity region 122 may be configured to make contact with the bottom surface of the second impurity region 114. A second depletion region DR2 for providing a second operational voltage may be formed at an interface region between the second impurity region 114 and the third impurity region 122. The second operational voltage may be higher than the first operational voltage. A bias voltage for applying the second operational voltage to the single photon avalanche diode 2 to perform the photoelectric transformation using the second depletion region DR2 may be applied to the first cathode Cathode1 and the first anode Anode1. A ground voltage may be applied to the second anode Anode2 and the second cathode Cathode2.

The fourth impurity region 124 acting as the second cathode Cathode2 may be formed on the substrate Sub to partially make contact with the upper surface S1 of the substrate Sub. In order to improve the breakdown voltage characteristic of the single photon avalanche diode 2, the fourth impurity region 124 may have a doping concentration less than the doping concentration of the second impurity region 122. Further, a portion of the fourth impurity region 124 extended in the third direction D3 may have a horizontal width greater than a vertical depth of a portion of the fourth impurity region 124 extended in the first and second directions D1 and D2.

The fourth impurity region 124 may be configured to surround the side surface and the bottom surface of the third impurity region 122. Thus, the fourth impurity region 124 may have a cylindrical shape. The fourth impurity region 124 may have a planar annular shape viewed from the upper surface S1 of the substrate Sub. The fourth impurity region 124 may have a planar plate shape viewed from the lower surface S2 of the substrate Sub. Further, the fourth impurity region 124 may have a cross-sectional U shape. The fourth impurity region 124 may be configured to make contact with the side surface and the bottom surface of the third impurity region 122. A third depletion region DR3 for providing a third operational voltage may be formed at an interface region between the third impurity region 122 and the fourth impurity region 124. The third operational voltage may be higher than the second operational voltage. A bias voltage for applying the third operational voltage to the single photon avalanche diode 2 to perform the photoelectric transformation using the third depletion region DR3 may be applied to the second cathode Cathode2. A ground voltage may be applied to the first anode Anode1, the second anode Anode2 and the first cathode Cathode1.

Because the fourth impurity region 124 may be configured to make contact with the side surface of the third impurity region 122 as well as the bottom surface of the third impurity region 122, an area of the third depletion region DR3 may be readily enlarged. Thus, the single photon avalanche diode 2 may have improved breakdown voltage characteristics.

The third impurity region 122 and the fourth impurity region 124 may be formed by a well formation process and a deep well formation process. Therefore, FIGS. 2A and 3B may show each of the third impurity region 122 and the fourth impurity region 124 including one impurity region. Alternatively, each of the third impurity region 122 and the fourth impurity region 124 may include a deep well region and a well region. The deep well region may be formed in the substrate Sub. The deep well region may have a plate shape. The well region may be extended from the upper surface S1 of the substrate Sub. The well region may have a pipe shape. The well region having the pipe shape may include a plurality of well region stacked in the third direction D3.

Further, the second junction structure 120 may further include an isolation region 126 configured to surround the side surface of the first junction structure 110. The isolation region 126 may include one side surface configured to make contact with the second impurity region 114, and the other side surface configured to make contact with the third impurity region 122. The isolation region 126 may have a depth measured from the upper surface S1 of the substrate Sub substantially the same as the depth of the second impurity region 114. That is, the isolation region 126 may include a bottom surface of the third impurity region 122. The isolation region 126 may include an impurity region having the first conductive type, or a trench type isolation layer. When the isolation region 126 may include the impurity region having the first conductive type, the isolation region 126 may have a doping concentration less than the doping concentration of the third impurity region 122. The trench type isolation layer may include a trench formed at the upper surface S1 of the substrate Sub, and an isolation layer formed in the trench.

As mentioned above, the single photon avalanche diode 2 may include the first junction structure 110 and the second junction structure 120 stacked in the third direction D3 with surfaces of the first junction structure 110 and the second junction structure 120 being overlapped with each other to provide the three depletion regions DR1, DR2 and DR3. Therefore, the single photon avalanche diode 2 may have the three operational voltages corresponding to the three depletion regions DR1, DR2 and DR3. As a result, the single photon avalanche diode 2 may have improved photo detection sensitivity in various environments so that the single photon avalanche diode 2 may be widely used in various applications.

Figure 3B:
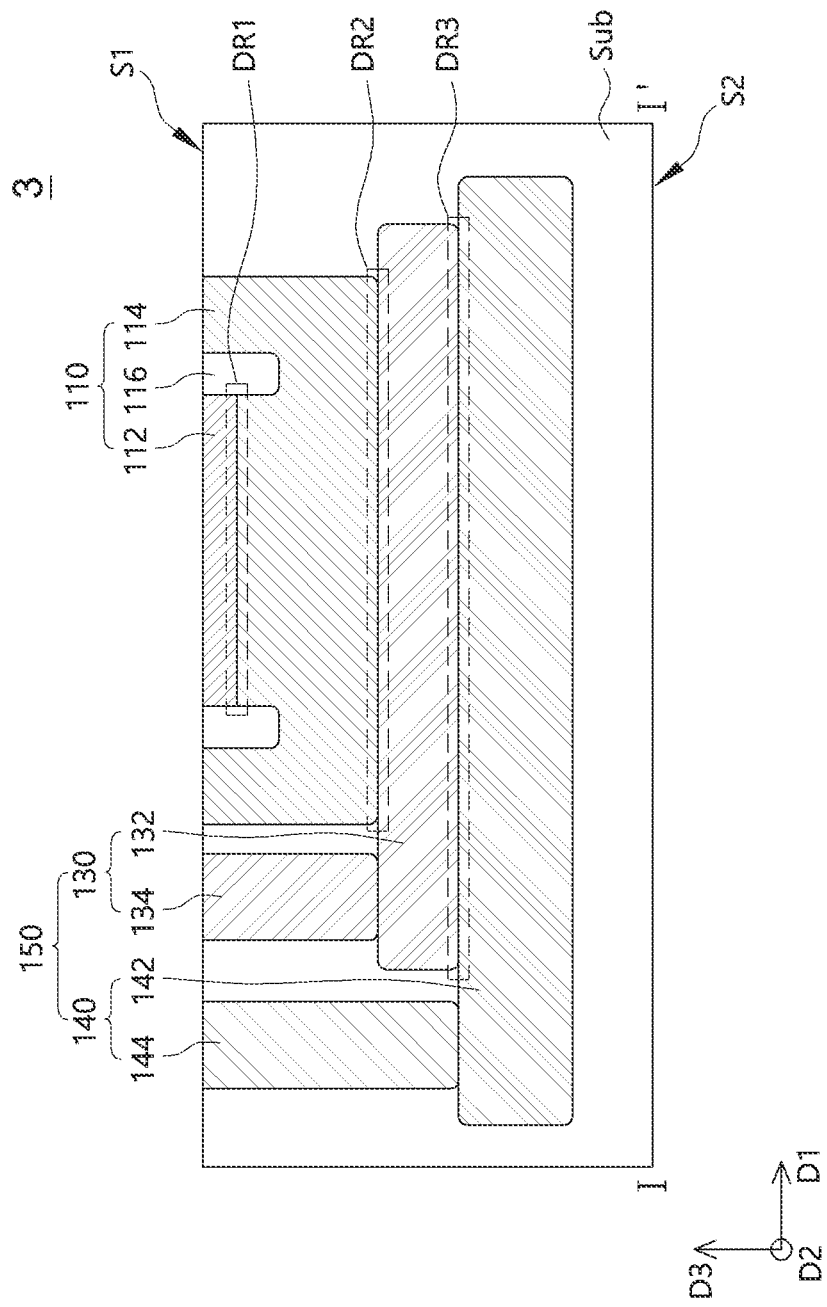

FIG. 3A is a plan view illustrating a single photon avalanche diode in accordance with example embodiments, and FIGS. 3B and 3C are cross-sectional views taken along a line I-I' in FIG. 3A. Hereinafter, the single photon avalanche diode having different operational voltages may be illustrated with reference to FIGS. 3A to 3C. Further, the same reference numerals may refer to the same elements and any further illustrations with respect to the same elements may be omitted herein for brevity.

Referring to FIGS. 3A and 3B, the single photon avalanche diode 3 of example embodiments may include a substrate Sub, a first junction structure 110 and a second junction structure 150. The substrate Sub may have an upper surface S1 and a lower surface S2. The first junction structure 110 may be formed on the substrate Sub to make contact with the upper surface S1 of the substrate Sub. The second junction structure 150 may be configured to surround a bottom surface of the first junction structure 110. The second junction structure 150 may be overlapped with the first junction structure 110 in the third direction D3. Each of the first junction structure 110 and the second junction structure 150 may include a P—N junction diode. Each of the first junction structure 110 and the second junction structure 150 may include a first anode Anode1, a first cathode Cathode1, a second anode Anode2 and a second cathode Cathode2 configured to receive a bias. Thus, a first anode Anode1, a first cathode Cathode1, a second anode Anode2 and a second cathode Cathode2 receive different voltages.

The first junction structure 110 may include a first impurity region 112 having a first conductive type and a second impurity region 114 having a second conductive type. The first junction structure 110 may further include a guard ring 116 formed in the second impurity region 114 to surround the side surface of the first impurity region 112. When the first conductive type may be a P type and the second conductive type may be an N type, the first impurity region 112 may act as the first anode Anode1 and the second impurity region 114 may act as the first cathode Cathode1. The first anode Anode1 and the first cathode Cathode1 may be configured to receive the bias. Any further illustrations with respect to the first junction structure 110 may be omitted herein for brevity.

The second junction structure 150 may include a third impurity region 130 having the first conductive type and a fourth impurity region 140 having the second conductive type. When the first conductive type may be a P type and the second conductive type may be an N type, the third impurity region 130 may act as the second anode Anode2 and the fourth impurity region 140 may act as the second cathode Cathode2. The second anode Anode2 and the second cathode Cathode2 may be configured to receive the bias.

The third impurity region 130 acting as the second anode Anode2 may include a first deep well region 132 and a first well region 134. The first deep well region 132 may be formed in the substrate Sub to make contact with the bottom surface of the second impurity region 114. The first well region 134 may be electrically connected with the first deep well region 132. The first well region 134 may be formed at the substrate Sub to make contact with the upper surface S1 of the substrate Sub. The first well region 134 may have a pillar shape. The first deep well region 132 may have a plate shape overlapped with the second impurity region 114. In FIG. 3B, the first deep well region is disposed to contact the entire bottom surface of the second impurity region 114, but other implementations are also possible. In FIG. 3B, the first well region 134 may include one impurity region. Alternatively, the first well region 134 may include a plurality of impurity regions stacked in the third direction D3.

The fourth impurity region 140 acting as the second cathode Cathode2 may include a second deep well region 142 and a second well region 144. The second deep well region 142 may be formed in the substrate Sub to make contact with the bottom surface of the first deep well region 132 of the third impurity region 130. The second well region 144 may be electrically connected with the second deep well region 142. The second well region 144 may be formed at the substrate Sub to make contact with the upper surface S1 of the substrate Sub. The second well region 144 may have a pillar shape. The second deep well region 142 may have a plate shape fully overlapped with the second impurity region 114 and the first deep well region 132. In FIG. 3B, the second well region 144 may include one impurity region. Alternatively, the second well region 144 may include a plurality of impurity regions stacked in the third direction D3.

In FIGS. 3A and 3B, each of the first well region 134 and the second well region 144 may have a planar bar shape. Alternatively, the first well region 134 may have a pipe shape spaced apart from the side surface of the second impurity region 114 to surround the side surface of the second impurity region 114. Similarly, the second well region 144 may have a pipe shape configured to surround the side surface of the first junction structure 110 together with the first well region 134. The second well region 144 may be configured to make contact with the side surface of the first well region 134.

Referring to FIGS. 3A and 3C, in a second junction structure 150 of a single photon avalanche diode 4 of example embodiments, a third impurity region 130 may include a first deep well region 132 and a first vertical electrode 136. The first deep well region 132 may be formed at the substrate Sub to make contact with the bottom surface of the second impurity region 114. The first vertical electrode 136 may be electrically connected with the first deep well region 132. The first vertical electrode 136 may have a pillar shape configured to make contact with the upper surface S1 of the substrate Sub. The first vertical electrode 136 may include a first trench 136a, a first insulation spacer 136b and a first conductive layer 136c. The first trench 136a may be formed at the upper surface S1 of the substrate Sub. The first insulation spacer 136b may be formed on a side surface of the first trench 136a. The first conductive layer 136c may be formed in the first trench 136a.

Similarly, in the second junction structure 150 of the single photon avalanche diode 4 of example embodiments, a fourth impurity region 140 may include a second deep well region 142 and a second vertical electrode 146. The second deep well region 142 may be formed at the substrate Sub to make contact with the bottom surface of the first deep well region 132. The second vertical electrode 146 may be electrically connected with the second deep well region 142. The second vertical electrode 146 may have a pillar shape configured to make contact with the upper surface S1 of the substrate Sub. The second vertical electrode 146 may include a second trench 146a, a second insulation spacer 146b and a second conductive layer 146c. The second trench 146a may be formed at the upper surface S1 of the substrate Sub. The second insulation spacer 146b may be formed on a side surface of the second trench 146a. The second conductive layer 136c may be formed in the second trench 146a.

In FIGS. 3A and 3C, each of the first well region 134 and the second well region 144 may have a planar bar shape. Alternatively, the first vertical electrode 136 may have a pipe shape spaced apart from the side surface of the second impurity region 114 to surround the side surface of the second impurity region 114. Similarly, the second vertical electrode 146 may have a pipe shape configured to surround the side surface of the first junction structure 110 together with the first vertical electrode 136.

Figure 4:
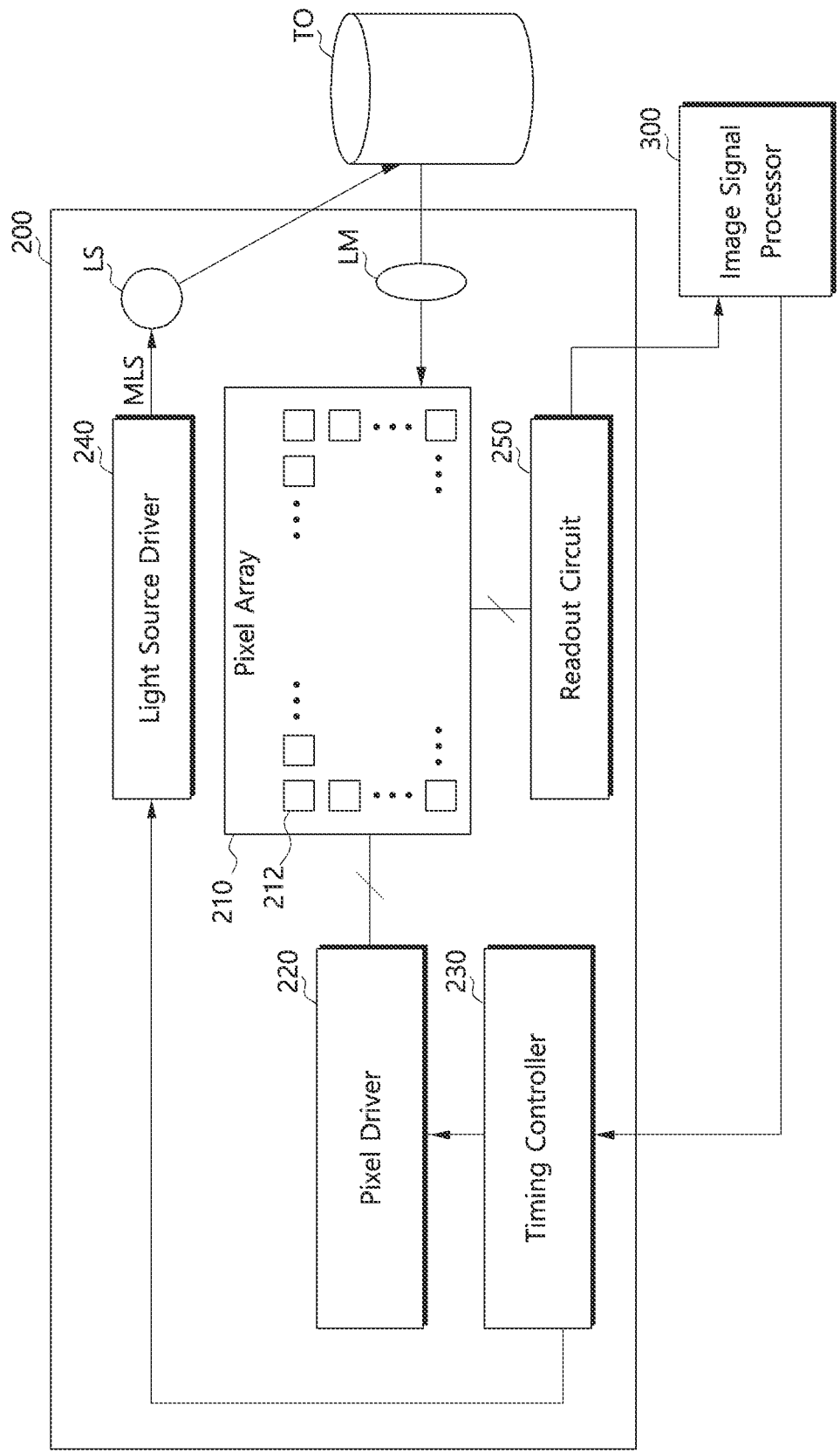
FIG. 4 is a view illustrating an electronic device including a single photon avalanche diode in accordance with example embodiments of the disclosed technology.

FIG. 4 is a view illustrating an electronic device including a single photon avalanche diode in accordance with example embodiments. The electronic device may include a photographing device including an image sensing device.

Referring to FIG. 4, the photographing device may include a digital still camera configured to photograph a static image, a digital video camera configured to photograph a video, etc. For example, the photographing device may include a digital single lens reflex (DSLR), a mirror less camera, a cellular phone, a smart phone, etc, not restricted within a specific kind. The photographing device may be a device including a lens an imaging device configured to photograph an object and generate an image.

The photographing device may include an image sensing device 200 and an image signal processor 300.

The image sensing device 200 may measure a distance using a principle of a time of flight (TOF). The image sensing device 200 may include a light source LS, a lens module LM, a pixel array 210, a pixel driver 220, a timing controller 230, a light source driver 240 and a readout circuit 250.

The light source LS may irradiate a light to an object TO in response to a clock signal MLS from the light source driver 240. The light source LS may include a laser diode for emitting a light having a specific wavelength such as an infrared light or a visible light, a light emitting diode (LED), a near infrared laser (NIR), a point light source, a white light lamp, a monochromatic illuminator, and a combination thereof. For example, the light source LS may emit an infrared light having a wavelength of about 800 nm to about 1,000 nm. FIG. 1 may show one light source LS. Alternatively, a plurality of the light sources LS may be arranged around the lens module LM.

The lens module LM may collect a light reflected from the object TO. The lens module LM may concentrate the reflected light on pixels of the pixel array 210. The lens module LM may include a condensing lens having a glass surface or plastic surface, a cylindrical optical element, etc. The lens module LM may include a lens group having at least one lens.

The pixel array 210 may include a plurality of SPAD pixels 212 sequentially arranged in a two-dimensional matrix structure. The SPAD pixels 212 of the pixel array 210 may be sequentially arranged in a column direction and a row direction. Each of the SPAD pixels 212 may perform a photoelectric transformation on an incident light through the lens module LM to generate and output an electrical signal as a pixel array corresponding to the incident light. The pixel signal may include information corresponding to the distance from the object OT, not a color of the object OT. Each of the SPAD pixels 212 may include the single photon avalanche diode of example embodiments.

The pixel array 210 including the SPAS pixels 212 may detect the distance from the object TO using a direct TOF manner. The TOF technology may directly measure a reciprocation time between a light irradiation time toward the object TO and a light incident time from the object TO to calculate the distance from the object OT based on the reciprocation time and a light velocity.

The pixel driver 220 may drive the pixel array 210 in accordance with controls of the timing controller 230. For example, the pixel driver 220 may generate a quenching control signal for controlling a quenching operation to decrease a reverse bias voltage, which may be applied to the SPAD pixel 212, to no more than the breakdown voltage. Further, the pixel drive 220 may generate a recharging control signal for controlling a recharging operation to provide a sensing node, which may be connected with the SPAD pixel 212, with charges.

The readout circuit 250 may be arranged at a side of the pixel array 210 to calculate a time delay between a reference pulse and a pulse signal outputted from each of the SPAD pixels 220. The readout circuit 250 may generate and store digital data corresponding to the time delay. The readout circuit 250 may include a time-to-digital circuit configured to perform the above-mentioned functions. The readout circuit 250 may transmit the stored digital data to the image signal processor 300 in accordance with the controls of the timing controller 230.

The timing controller 230 may control total operations of the image sensing device 200. The timing controller 230 may generate a timing signal for controlling operations of the pixel driver 220 and the light source driver 240. Further, the timing controller 230 may control an activation or an inactivation of the readout circuit 250. The timing controller 230 may simultaneously or sequentially transmit the digital data in the readout circuit 250 to the image signal processor 300.

The light source driver 240 may generate the clock signal for driving the light source LS in accordance with the controls of the timing controller 230.

The image signal processor 300 may process the digital data inputted from the image sensing device 200 to generate depth image for representing the distance from the object OT. Particularly, the image signal processor 300 may calculate the distance by the pixels from the object OT based on the time delay represented by the digital data received from the readout circuit 250.

The image signal processor 300 may control the operations of the image sensing device 200. Particularly, the image signal processor 200 may analyze the digital data inputted from the image sensing device 200 to determine modes of the image sensing device 200. The image signal processor 300 may control the image sensing device 200 to be operated in a determined mode.

The image signal processor 300 may remove noises from the generated depth image. Further, the image signal processor 300 may process the image signal to improve image quality. The depth image outputted from the image signal processor 300 may be stored in the photographing device, an internal memory or an external memory of other devices with the photographing device, etc., automatically or by a user's request. The depth image may be displayed on a display device. The depth image outputted from the image signal processor 300 may be used for controlling operations of the photographing device or other devices.

Figure 5:
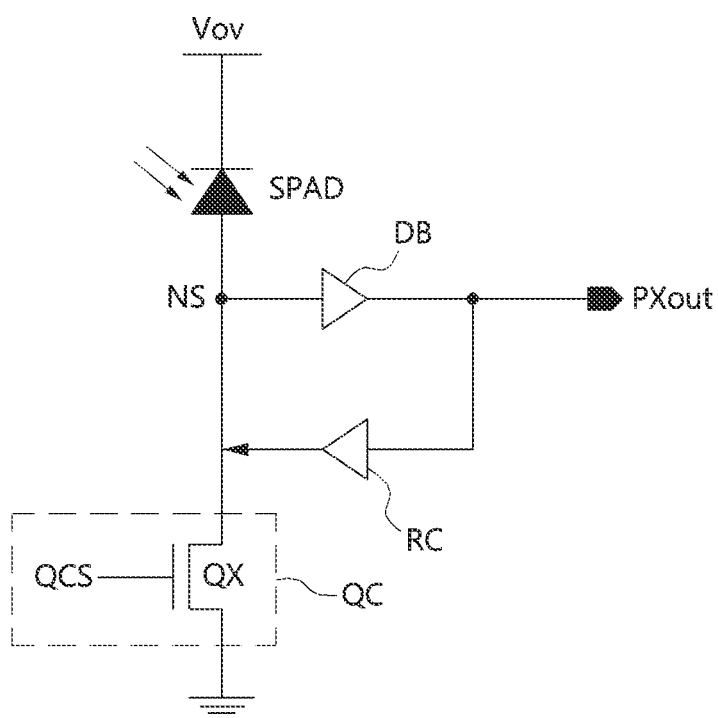
FIG. 5 is an equivalent circuit diagram illustrating an SPAD pixel in a pixel array of FIG. 4.

FIG. 5 is an equivalent circuit diagram illustrating an SPAD pixel in a pixel array of FIG. 4.

Referring to FIGS. 4 and 5, the SPAD pixel 212 may include the single photon avalanche diode (SPAD) as the photoelectric transformation element, a quenching circuit QC, a digital buffer DB and a recharging circuit RC. Here, the SPAD may include the structure in FIGS. 1A and 1B, the structure in FIGS. 2A and 2B, the structure in FIGS. 3A and 3B, or the structure in FIGS. 3A and 3C. The SPAD may include the multi-depletion regions and the multi-operational voltages corresponding to the multi-depletion regions.

The SPAD may detect the single photon reflected from the object TO to generate the current pulse corresponding to the single photon. The SPAD may include the photo diode having the photosensitive P-N junction. The avalanche breakdown may be triggered by an incident single photon in the Geiger mode where a reverse bias voltage including a voltage between a cathode and an anode higher than a breakdown voltage may be applied to generate the current pulse. The avalanche process may include triggering the avalanche breakdown by the single photon to generate the current pulse.

One terminal such as the cathode of the SPAD may receive a first bias voltage Vov for applying the reverse bias voltage higher than the breakdown voltage. The first bias voltage Vov may correspond to the operational voltage of any one of the multi-operational voltages to the SPAD. For example, the first bias voltage Vov may be a positive voltage having an absolute value lower than an absolute value of the breakdown voltage. The other terminal such as the anode of the SPAD may be connected to a sensing node NS. The SPAD may detect the single photon to output the generated current pulse to the sensing node NS.

The quenching circuit QC may control the reverse bias voltage applied to the SPAD. When a time of the avalanche process, or a time after the pulse generation of the clock signal MLS may be elapsed, a quenching transistor QX of the quenching circuit QC may be turned-on in response to a quenching control signal QCS to electrically connect the sensing node NS with a ground terminal. Thus, the reverse bias voltage applied to the SPAD may be decreased to a value less than the breakdown voltage and the quenching can occur to stop the avalanche process.

The digital buffer DB may sample the analog current pulse inputted into the sensing node NS to convert the analog current pulse into a digital pulse signal. The sampling manner may include converting the analog current pulse into a pulse signal having a logic level of '0' or '1' in accordance with as to whether a level of the current pulse may be no less than a critical level or not, not restricted within a specific manner. Thus, the pulse signal outputted from the digital buffer DB may be transmitted to the readout circuit 250 as a pixel output signal PXout.

The recharging circuit RC may implant charges into the sensing node NS to enter the SPAD into the Geiger mode for inducing the avalanche breakdown after quenching the avalanche process by the quenching circuit QC. For example, the recharging circuit RC may include a switch such as a transistor configured to selectively connect a second bias voltage with the sensing node NS in accordance with a recharging control signal. When the switch may be turned-on, a voltage of the sensing node NS may reach to the second bias voltage. For example, a sum of an absolute value of the second bias voltage and an absolute value of the first bias voltage may be higher than an absolute value of the breakdown voltage. The second bias voltage may be a negative voltage. Thus, the SPAD may enter into the Geiger mode to perform the avalanche process by the single photon received from next timing.

In example embodiments, the quenching circuit QC and the recharging circuit RC may include active element. Alternatively, the quenching circuit QC and the recharging circuit RC may include passive element. For example, the quenching transistor QX of the quenching circuit QC may be replaced by a resistor. The quenching control signal QCS and the recharging control signal may be transmitted to the pixel driver 220 in FIG. 4.

The readout circuit 250 may include a digital logic and an output buffer. The digital logic may calculate the time delay between the pulse signal of the SPAD pixel 212 and the reference pulse to generate the digital data. The output buffer may store the generated digital data. The digital logic and the output buffer may include a time-to-digital (TDC) circuit. The reference pulse may include a pulse of the clock signal MLS.

The above described embodiments are examples of implementation of the disclosed technology. Variations and enhancements of the disclosed embodiments and other embodiments may be made based on what is disclosed and/or illustrated in this patent document.

What is claimed is:

1. A single photon avalanche diode, comprising:
   a substrate having an upper surface and a lower surface that are opposite to each other;
   a plurality of junction structures formed in the substrate, each of the plurality of junction structures including a first portion exposed to the upper surface of the substrate and a second portion being in contact with an adjacent junction structure; and
   an isolation region positioned between first portions of the plurality of junction structures,
   wherein each of the plurality of junction structures comprises:
   a first impurity region having a first conductive type and corresponding to a part of the first portion that is configured to receive an anode bias; and
   a second impurity region having a second conductive type and corresponding to another part of the first portion that is configured to receive a cathode bias, the second impurity region formed to surround the first impurity region and contacting the first impurity region.

2. The single photon avalanche diode of claim 1, wherein the isolation region comprises an impurity region having the first conductive type or an isolation layer disposed in a trench provided on the upper surface of the substrate.

3. The single photon avalanche diode of claim 1, wherein the isolation region is disposed to be in contact with the upper surface of the substrate and having a pipe shape extending in a vertical direction.

4. The single photon avalanche diode of claim 1, wherein the plurality of junction structures include a first junction structure and a second junction structure disposed to surround the first junction structure, wherein the isolation region has a depth as same as a depth of the first junction structure.

5. The single photon avalanche diode of claim 4, wherein the first impurity region in the first junction structure has a plate shape, and the second impurity region in the first junction structure has a cylindrical shape configured to surround a side surface and a bottom surface of the first impurity region.

6. The single photon avalanche diode of claim 4, wherein the first impurity region and the second impurity region of the second junction structure has a cylindrical shape.

7. The single photon avalanche diode of claim 1, wherein the second impurity region in each of the plurality of junction structures is in contact with a side surface and a bottom surface of the first impurity region to surround the first impurity region.

8. The single photon avalanche diode of claim 1, wherein an Nth junction structure (N is a natural number of no less than 2) among the junction structures is configured to surround a side surface and a bottom surface of a (N−1)th junction structure inside the Nth junction structure.

9. The single photon avalanche diode of claim 8, wherein the first impurity region in the Nth junction structure is configured to make contact with a bottom surface of the second impurity region in the (N−1)th junction structure and spaced apart from a side surface of the second impurity region in the (N−1)th junction structure.

10. The single photon avalanche diode of claim 1, wherein a depletion region is formed between the first and second impurity regions of each of the plurality of junction structures, and between second portions of the plurality of junction structures being contacted with each other.

11. A single photon avalanche diode comprising:
a substrate having an upper surface and a lower surface that are opposite to each other; and
a first impurity region having a first conductive type and disposed in contact with the upper surface of the substrate;
a second impurity region having a second conductive type and having a portion disposed in contact with the upper surface of the substrate, the second impurity region configured to make contact with a side surface and a bottom surface of the first impurity region;
a guard ring formed in the second impurity region and disposed to be in contact with the side surface of the first impurity region to surround the first impurity region;
a third impurity region having the first conductive type and having a portion disposed in contact with the upper surface of the substrate, the third impurity region configured to make contact with a bottom surface of the second impurity region; and
a fourth impurity region having the second conductive type and having a portion disposed in contact with the upper surface of the substrate, the fourth impurity region configured to make contact with a side surface and a bottom surface of the third impurity region.

12. The single photon avalanche diode of claim 11, further comprising:

an isolation region disposed in an interface between the side surface of the second impurity region and the side surface of the third impurity region.

13. The single photon avalanche diode of claim 12, wherein each of the guard ring and the isolation region comprises an impurity region having the first conductive type or an isolation layer disposed in a trench provided on the upper surface of the substrate.

14. The single photon avalanche diode of claim 12, wherein the guard ring and the isolation region are disposed to make contact with the upper surface of the substrate and have a pipe shape extending in a vertical direction.

15. The single photon avalanche diode of claim 12, wherein the isolation region has a depth same as a depth of the second impurity region.

16. The single photon avalanche diode of claim 11, wherein the third impurity region and the fourth impurity region have a cylindrical shape.

17. The single photon avalanche diode of claim 11, wherein the third impurity region comprises a first deep well having a plate shape and disposed to be in contact with the bottom surface of the second impurity region, and a first well having ends vertically extending to make contact with the upper surface of the substrate and the first deep well, respectively, and the fourth impurity region comprises a second deep well having a plate shape and disposed to be in contact with the bottom surface of the third impurity region, and a second well having ends vertically extending to make contact with the upper surface of the substrate and the second deep well, respectively.

18. The single photon avalanche diode of claim 17, wherein each of the first well and the second well comprises a plurality of vertically stacked well regions.

19. The single photon avalanche diode of claim 11, wherein the third impurity region comprises a first deep well having a plate shape and disposed to be in contact with the bottom surface of the second impurity region, and a first electrode having ends vertically extending to contact with the upper surface of the substrate and the first deep well, respectively, and the fourth impurity region comprises a second deep well having a plate shape and disposed to be in contact with the bottom surface of the third impurity region, and a second electrode having ends vertically extending to make contact with the upper surface of the substrate and the second deep well, respectively.

20. The single photon avalanche diode of claim 19, wherein each of the first electrode and the second electrode comprises:
a trench formed at the upper surface of the substrate;
an insulation spacer formed on a side surface of the trench; and
a conductive layer formed in the trench.

\* \* \* \* \*